United States Patent
Petricek

(10) Patent No.: US 6,801,432 B2
(45) Date of Patent: Oct. 5, 2004

(54) RETAINER ELEMENT FOR ELECTRICAL COMPONENTS FOR ASSEMBLY ON CIRCUIT SUPPORTS

(75) Inventor: Martin Petricek, Hollabrunn (AT)

(73) Assignee: Siemens AG Österreich, Vienna (AT)

( * ) Notice: Subject to any disclaimer, the term of this patent is extended or adjusted under 35 U.S.C. 154(b) by 0 days.

(21) Appl. No.: 10/473,439

(22) PCT Filed: Mar. 4, 2002

(86) PCT No.: PCT/AT02/00065

§ 371 (c)(1),
(2), (4) Date: Sep. 30, 2003

(87) PCT Pub. No.: WO02/085084

PCT Pub. Date: Oct. 24, 2002

(65) Prior Publication Data

US 2004/0093722 A1 May 20, 2004

(30) Foreign Application Priority Data

Apr. 12, 2001 (AT) ............................. A 605/2001

(51) Int. Cl.⁷ ................................................. H05K 7/20
(52) U.S. Cl. ................... 361/704; 361/707; 361/719; 361/760; 257/718; 257/719
(58) Field of Search ................................ 361/704, 707, 361/709, 717–720; 257/718, 719, 727; 165/80.2, 80.3; 174/16.1, 16.3

(56) References Cited

U.S. PATENT DOCUMENTS

| 4,219,172 A | 8/1980 | Murayama ................. 248/27.3 |
| 4,577,259 A | 3/1986 | Latasiewicz et al. ........ 361/681 |
| 4,667,270 A | 5/1987 | Yagi ........................... 361/681 |
| 4,674,008 A | 6/1987 | Oyama et al. .............. 361/681 |
| 4,847,449 A * | 7/1989 | Jordan et al. ........... 174/138 G |
| 5,277,612 A | 1/1994 | Windham, Jr. et al. ..... 439/326 |
| 5,504,653 A * | 4/1996 | Murphy et al. ............. 361/704 |
| 5,592,021 A * | 1/1997 | Meschter et al. ........... 257/727 |
| 5,901,781 A * | 5/1999 | Arai et al. ................. 165/80.3 |
| 5,909,358 A * | 6/1999 | Bradt ......................... 361/707 |
| 5,991,151 A * | 11/1999 | Capriz ........................ 361/704 |
| 5,991,154 A * | 11/1999 | Clemens et al. ............ 361/704 |
| 6,535,383 B2 * | 3/2003 | Terhaar et al. .............. 361/690 |
| 6,587,344 B1 * | 7/2003 | Ross .......................... 361/704 |

FOREIGN PATENT DOCUMENTS

| DE | 42 31 141 | 3/1994 |
| EP | 0 540 955 | 5/1993 |
| GB | 2 192 492 | 1/1988 |
| JP | 11-274772 | 8/1999 |

* cited by examiner

*Primary Examiner*—Boris Chervinsky

(57) ABSTRACT

A retainer element for at least one electrical component for assembly on circuit supports, such as, e.g., on printed circuit boards. The retainer element is comprised of at least one body, which has at least one uptake for the component. The component can be inserted in the uptake, and the body has at least one fastening element, by means of which it can be fastened to the circuit support. For example, the fastening elements are configured as catch hooks.

15 Claims, 2 Drawing Sheets

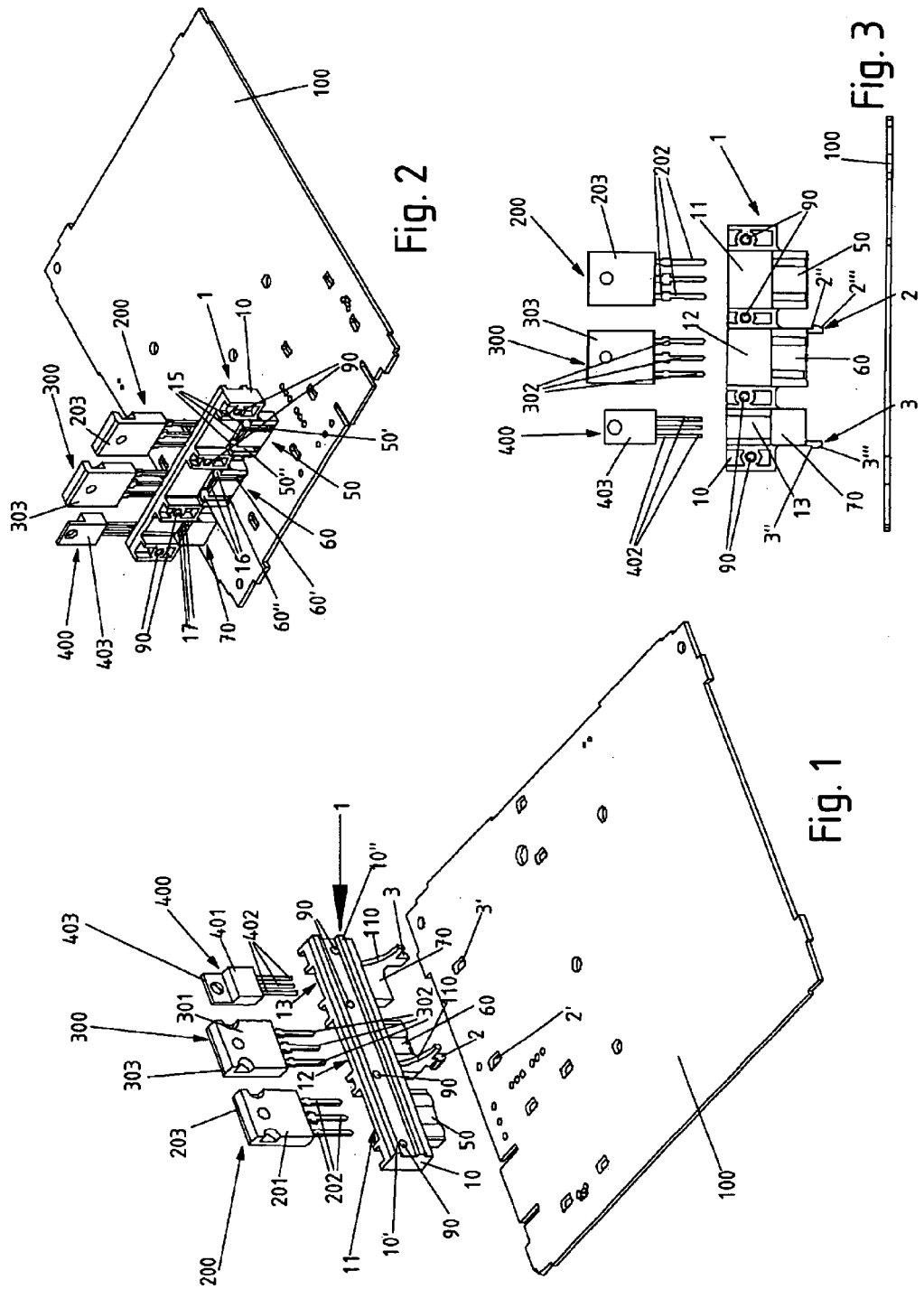

RETAINER ELEMENT FOR ELECTRICAL COMPONENTS FOR ASSEMBLY ON CIRCUIT SUPPORTS

1. FIELD OF THE INVENTION

The invention concerns a retainer element for at least one electrical component for assembly on circuit supports, such as, e.g., on printed circuit boards.

2. DISCUSSION OF THE BACKGROUND ART

When structural components such as semiconductors, for example, are mounted on printed circuit boards, it is necessary to hold them in a specific position for soldering with the printed circuit board. Usually separate holding devices are used for this purpose, by means of which the structural components are held in their position during soldering. After soldering, which is generally conducted by machine with a so-called solder wave, this holding device for the components must then be removed again.

The time needed for introducing and then dismantling the holding device is a particular disadvantage in this conventional procedure, due to the higher costs for assembly that are involved, and thus the production costs are also increased.

SUMMARY OF THE INVENTION

One object of the invention is to design the assembly of electrical components onto circuit supports in a way that saves times and reduces cost.

This object is solved by means of a retainer element as described above, which, according to the invention, is comprised of at least one body, which has at least one uptake for the component and the component can be inserted therein, and the body has at least one fastening element, by means of which it can be fastened to the circuit support.

The assembly of electrical components onto the circuit support is substantially simplified with the retainer element according to the invention. Components such as semiconductors can be inserted in a simple way into the provided uptake, where they are relatively stably seated for the time being. Then the retainer element is affixed with its fastening means in the circuit support, whereby this connection can basically also be unfastened again if desired. Of course, it is also possible to fasten the retainer element first to the circuit support and then to equip it with the components.

In one tested embodiment of the invention, boreholes are provided in the circuit support for the fastening elements, and the latter are affixed in these boreholes.

A stable seating of the component is assured if at least one of the fastening elements is configured as a catch hook.

It is advantageous if the fastening elements are configured elastically. In this way, a particularly stable seating is achieved, but it is also possible to remove these elements again from the circuit support, without damaging the circuit support or the catch hook.

It is particularly favorable if the fastening elements are elastic tongues projecting from the body, and these tongues have a catch face, which cooperates with the side of the circuit support opposite from the body, when it is in the locked state.

In addition, it is also favorable, if the elastic tongues have oblique leading surfaces, which connect to the catch face. When the fastening elements of the retainer element are slid into the corresponding, assigned boreholes in the circuit support, the fastening elements can then be easily guided into these boreholes along the leading surfaces, whereby the elastic fastening elements are pressed back at the same time, and the tongues can be hooked to the circuit support.

In the sense of a stable support of the retainer element, it is further advantageous if the at-least one fastening element is accommodated on an arm which is arranged laterally in a spring-away manner on one side of the body opposite from the at-least one uptake.

Therefore, a stable seating of the retainer element is assured, if at least two fastening elements are provided.

For a stable seating of a component in an uptake, it is further appropriate if the at-least one uptake is essentially adapted to the shape of the housing of the component.

In one advantageous embodiment of the invention, the at-least one uptake is formed so that it is open in an upper region opposite from the circuit support in the affixed state, so that the component can be easily inserted into the uptake.

Thus it is possible to provide contact between a component arranged in the retainer element and the circuit support, if the at-least one uptake has openings for connection elements of the component in a lower region facing the circuit support, in the case of one tested embodiment.

Semiconductors in particular are often very warm during operation. In order to guarantee an orderly functioning, for the most part, a removal of heat from the semiconductor is necessary. For this purpose, the latter is brought into contact with a cooling unit, for example, an aluminum profile, so that the heat arising in the semiconductor can be at least partially transferred to the cooling unit. It is necessary that the semiconductor has a good contact with the cooling unit so that a good heat transfer can occur. Usually, for this purpose, semiconductor components are pressed against the cooling unit with at least one separate additional pressing element, for example, a clamp of spring sheet metal. It is a disadvantage, in turn, that an additional element is necessary, which must be introduced in a separate working step, so that longer assembly times result, along with the corresponding costs associated therewith.

In order to eliminate these disadvantages, in the retainer element according to the invention, the at-least one uptake is formed open on at least one side.

It is further of advantage if the at-least one uptake has a structural depth which is less than the housing thickness of the component, so that the latter protrudes in regions beyond the body of the retainer element.

By means of this configuration of the uptake, the component can be contacted with the cooling unit by pressing the retainer element against the cooling unit that has a heat-removing surface, so that a good removal of heat can occur.

A particularly solid seating of the component, especially in an uptake that is open on at least one side, is then assured, if the retainer element has connection uptakes for connection elements of the component.

For better electromagnetic compatibility, the connection elements are sometimes provided with so-called ferrite beads or ferrite sheaths, which have a cylindrical form for the most part and can be slipped onto the connection elements. The connection elements can be simply positioned In this way, if one or more connection uptakes have an essentially hollow cylindrical configuration. The ferrite sheaths can then be pushed into the connection uptakes even prior to introducing the component and are then securely positioned therein, but it is also possible to slip the sheaths onto the connection elements to begin with and then introduce them into the uptakes together with the component.

Even if sheaths as described above are not pushed onto the connection elements, a stable seating of the components is promoted, if one or more connection uptakes are essentially adapted to the cross section of the connection elements.

In a concrete embodiment of a retainer element, in a lower region, the body has one or more projections in which the connection uptake(s) is/are arranged.

A pressing of the component(s) arranged in the retainer element against a cooling unit is reliable and can be carried out with high pressing pressure, if the body has one or more openings for fastening, by means of which it can be affixed to a cooling unit with the use of fastening means. For example. a screwing of the retainer element with the cooling unit Is possible in this way.

A concrete embodiment of the retainer element is characterized by the fact that it is formed of glass-fiber-reinforced polyamide.

BRIEF DESCRIPTION OF THE DRAWINGS

The invention is presented in more detail below, based on the drawing. In the drawing:

FIG. 1 shows a perspective rear view of a retainer element according to the invention, FIG. 2 shows a perspective front view of a retainer element according to FIG. 1, FIG. 3 shows a view of the front side.

DETAILED DESCRIPTION OF THE PREFERRED EMBODIMENT

Figures 4, 5:
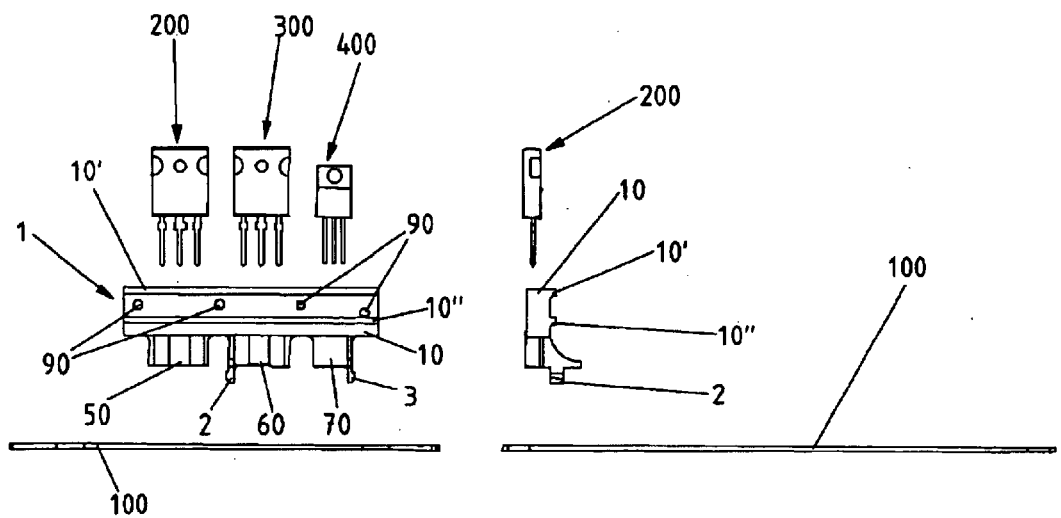
FIG. 4 shows a view of the back side.
FIG. 5 shows a lateral view of the retainer element according to FIG. 1.

A retainer element 1 according to the invention for electrical components, for example, for semiconductors 200, 300, 400 is shown in FIGS. 1–6. The retainer element 1 essentially consists of a body 10, which has three uptakes 11, 12, 13 for semiconductors 200, 300, 400 in the embodiment shown. Basically, a retainer element according to the invention may also have only one or two uptakes, but there can also be more than three uptakes, roughly four, five, six or more.

The uptakes 11, 12, 13 are essentially adapted to the housing shape of the respective component to be accommodated, so that the latter is reliably held in the uptake. For example, the uptake 13 for the semiconductor 400 is designed smaller than the other two uptakes 11 and 12, since semiconductor 400 also has a smaller housing than the two other semiconductors 200, 300.

The retainer element 1 shown in the figures is particularly provided for semiconductors, for which reason, uptakes 11–13 are designed open on at least one side of body 10, designated the front side in the following, in order to make possible a removal of heat from semiconductors 200–400.

Figure 6:
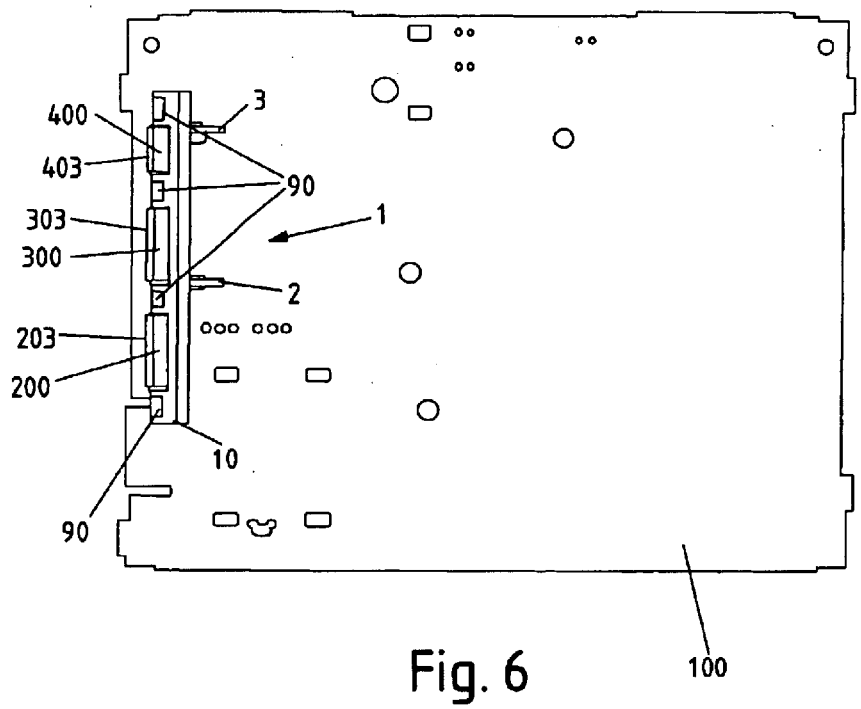
FIG. 6 shows a top view onto a retainer element according to the invention fastened in a printed circuit board.

It can further be recognized that the uptakes are dimensioned with a smaller depth dimension than the respective thickness of the semiconductor, so that the latter protrudes beyond body 10 in regions, particularly by those surfaces 203, 303, 403, by means of which heat is removed from semiconductors 200–400, as can be seen particularly well in FIG. 6.

For electrical connections 202, 302, 402 of the semiconductors, the uptakes 11–13 have openings 15, 16, 17 in a lower region, for plugging in the connections, which are, for example, shaped as pins. In an upper region opposite from circuit support 100, when affixed to this latter, the uptake is also designed open, in order to make possible a simple introduction of the components to be held, but of course, it is also very well possible to create embodiments without such an open configuration of the uptake in its upper region.

Thus, in an uptake open on one side, the electrical components are stably arranged in retainer element 1, since in the embodiment of the invention which is shown, the retainer element 1 still has its own separate connection uptakes 50', 50"; 60', 60", in which one or more of the connections of a semiconductor is (are) accommodated. For this purpose, the body 10, in its lower region facing the circuit support 100 has its own projections 50, 60, 70, in which the connection uptakes are arranged, which result as a continuation of the openings 15, 16, 17. The connection uptakes 50', 50"; 60', 60' are designed relative to their longitudinal dimension such that the connections 202, 302, 402 protrude far enough that a soldering with a circuit support, for example, a printed circuit board 100, is made possible in a simple way and this connection is reliable. Thus, in FIG. 3 only the two outer connection uptakes for the larger semiconductors 200, 300 can be seen, while only openings 15, 16, 17 from the central uptakes as well as from the connection uptakes can be seen for the smaller semiconductor 400.

Basically, these connection uptakes can be designed open or closed in regions; the limitations here lie predominantly in a favorable manufacturing technique. Of course, in an embodiment that is open in regions, care must be taken that at least one connection element is surrounded at least partially by the connection uptake, so that the semiconductor is secured against falling out laterally or toward the front from its uptake 11, 12, 13. For example, it can be well recognized in FIG. 2 that the two uptakes 50', 50"; 60', 60" for the two outer connection pins of the larger semiconductors 200, 300 have an essentially hollow-cylindrical configuration, whereby the latter are configured open on their front side, while the uptake for the central connection pin is closed and is essentially adapted to the cross-sectional dimensions of the pin, whereby the semiconductor achieves a stable seating in retainer element 1. Basically, without anything further, the uptakes 50', 50"; 60', 60" can have the configuration shown; in the embodiment shown, this configuration, of course, is designed so that so-called ferrite sheaths are pushed onto the two outer connection pins of the semiconductor for better electromagnetic compatibility, which are thus comfortably held in uptakes 50', 50", 60', 60", without an additional troublesome mounting of these sheaths, as is otherwise usually necessary in practice.

For fastening retainer element 1 to a printed circuit board 100, the body 10 has, in a lower region, fastening elements, which are formed as catch hooks 2, 3 in the embodiment shown. The retainer element 1 can be inserted into the correspondingly shaped recesses 2', 3' in the printed circuit board by these two catch hooks 2, 3 and can be locked therein. In this way, the retainer element 1 is held stably in circuit board 100 and also the semiconductors are stably positioned and can be soldered with circuit board 100 in this position. The retainer element itself remains on circuit board 100 after soldering, so that another working step is not necessary for removal of the element. In addition, the electrical components are still supported by the retainer element 1 for their stability in the affixed state.

It is particularly favorable if, as is shown in the drawing, the fastening elements 2, 3 are elastic tongues projecting from the body, and these tongues have a catch face 2", 3", which cooperates with the side of the circuit support 100 opposite from the body 10, when it is in the locked state. In addition, it is also favorable, if the elastic tongues 2, 3 have oblique leading surfaces 2''', 3''', which connect to the catch faces 2", 3". When the fastening elements 2, 3 of the retainer element 1 are slid into the corresponding, assigned boreholes 2', 3' in the circuit support 100, the fastening elements can then be easily guided into these boreholes along the leading surfaces 2''', 3''', whereby the elastic fastening elements are pressed back at the same time, and the tongues can be hooked to the circuit support 100.

In the embodiment of retainer element 1 which is shown, the fastening elements 2, 3 are each arranged on an arm 110, which is arranged laterally in a spring-away manner on one side of the body 10 opposite from the at-least one uptake 11, 12, 13. It is particularly favorable if a bearing surface of the one arm 110 cooperating with the circuit support 100 in the affixed state of retainer element 1 and the surfaces of projections 50, 60, 70 facing the circuit support 100 lie in one plane. In this way, the retainer element 1 is applied on the circuit support 100 both by the bearing surface of the arm and by the underside of projections 50, 60, 70, whereby a particularly good support of retainer element 1 is achieved.

In the case of larger retainer elements, it may also be provided that more than only two fastening elements are provided, roughly three, four, five, six, seven, eight, nine or ten fastening elements. Furthermore, it is also conceivable, however, to use only one fastening element, for example, in the form of a catch hook, for the fastening of the retainer element to the printed circuit board. Of course, then a corresponding counter-support is usually necessary, in order to keep the retainer element correspondingly in position.

As has already been addressed several times, usually a removal of heat is necessary in the case of semiconductors. The latter are usually pressed against a cooling unit for this purpose, for example, against an aluminum plate, which is not shown in the drawing and which is connected to the circuit support. A sort of clamp or a stirrup piece is used for this purpose, by means of which each semiconductor can be pressed against the cooling unit. It is a disadvantage here, as was mentioned initially, that the clamp must be introduced in a separate working step for each semiconductor.

In order to simplify this problem, body 10 of the retainer element 1 has one or more openings 90, by means of which body 10 can be screwed together with the cooling unit, whereby the retainer element is arranged in such a way that body 10 faces the cooling unit by the open side of the uptake(s). By screwing the body 10 together with the cooling unit, the semiconductors 200, 300, 400 can be pressed by their heat-removal surfaces 203, 303, 403 against the cooling unit, with high pressing pressure, so that a good heat transfer can occur.

The retainer element 1 is usually comprised of a plastic that is resistant to high temperatures, for example, glass-fiber-reinforced polyamide. Therefore; when high pressing pressures occur during the screwing of the body 10 with a cooling unit, body 10 does not experience too great a bending, if it is designed reinforced in a lower region opposite from the side having the uptakes, in the depicted embodiment of the invention. For example, reinforcements run in this region over the entire width of body 10 in an upper region as well as in a lower region, roughly in the shape of crosspieces 10', 10". In the depicted embodiment, these are designed throughout the width, but they can also be arranged only in regions at particularly highly loaded places. The reinforcements can be formed in one piece with body 10 or can be arranged additionally on this body. According to the depicted embodiment, it has been proven favorable if, in a side view such as that according to FIG. 5, the body has essentially a U profile together with crosspieces 10', 10" on its back side. Of course, the reinforcement of the body is also conceivable, however, with only one such crosspiece, for example.

What is claimed is:

1. A retainer element for at least one electrical component, from which heat is removed during operation, for assembly on circuit supports, whereby the retainer element is comprised of at least one body, which has at least one uptake for the component in which the latter can be inserted, and the body has at least one fastening element, formed as a catch hook, by means of which it can be fastened to the circuit support, wherein the at-least one uptake is essentially adapted to the shape of the housing of component and is designed open on at least one side, and has a structural depth which is less than the housing thickness of the component, so that the latter protrudes beyond the body in regions, and the body has one or more openings for fastening, by means of which it can be affixed to a cooling unit with the use of fastening means.

2. The retainer element according to claim 1, further comprising boreholes provided in the circuit support for fastening elements, and the latter can be affixed in these boreholes.

3. The retainer element according to claim 1, wherein the fastening elements are elastically designed.

4. The retainer element according to claim 1, wherein the fastening elements are elastic tongues projecting from the body, and these tongues have a catch face, which cooperates with the side of the circuit support opposite from the body, when it is in the locked state.

5. The retainer element according to claim 4, wherein the elastic tongues have oblique leading surfaces, which connect to the catch faces.

6. The retainer element according to claim 1, wherein the at-least one fastening element is arranged on an arm which is arranged laterally in a spring-away manner on one side of the body opposite from the at-least one uptake.

7. The retainer element according to claim 1, wherein said retainer element comprises are at least two fastening elements.

8. The retainer element according to claim 1, wherein the at-least one uptake is formed so that it is open in an upper region opposite from the circuit support in the affixed state, so that the component can be inserted into the uptake.

9. The retainer element according to claim 1, wherein the at-least one uptake has openings for connection elements of the component in a lower region facing the circuit support.

10. The retainer element according to claim 1, further comprising a plurality of connection uptakes for connection elements of component.

11. The retainer element according to claim 10, wherein at least one connection uptake has an essentially hollow cylindrical configuration.

12. The retainer element according to claim 10, wherein at least one connection uptake is essentially adapted to the cross section of a connection element.

13. The retainer element according to claim 10, wherein the body, in a lower region, has one or more projections, in which the connection uptake(s) is/are arranged.

14. The retainer element according to claim 1, wherein said retainer element is formed of glass-fiber-reinforced polyamide.

15. The retainer element according to claim 1, for assembly of one or more semiconductors on a circuit support.

* * * * *